United States Patent
Lee et al.

(10) Patent No.: US 10,047,284 B2
(45) Date of Patent: Aug. 14, 2018

(54) PEROVSKITE NANOCRYSTAL PARTICLE LIGHT-EMITTER WHOSE CONTENT IS CHANGED, METHOD OF PRODUCING THE SAME, AND LIGHT EMITTING ELEMENT USING THE SAME

(71) Applicant: POSTECH ACADEMY-INDUSTRY FOUNDATION, Pohang-si, Gyeongsangbuk-Do (KR)

(72) Inventors: Taewoo Lee, Pohang-si (KR); Sanghyuk Im, Hwaseong-si (KR); Younghoon Kim, Daejeon (KR); Himchan Cho, Daegu (KR)

(73) Assignee: POSTECH ACADEMY-INDUSTRY FOUNDATION, Pohang-si, Gyeongsangbuk-Do (KR)

( * ) Notice: Subject to any disclaimer, the term of this patent is extended or adjusted under 35 U.S.C. 154(b) by 0 days.

(21) Appl. No.: 15/524,747
(22) PCT Filed: Nov. 6, 2015
(86) PCT No.: PCT/KR2015/011962
§ 371 (c)(1),
(2) Date: Jul. 5, 2017
(87) PCT Pub. No.: WO2016/072808
PCT Pub. Date: May 12, 2016

(65) Prior Publication Data
US 2017/0342317 A1 Nov. 30, 2017

(30) Foreign Application Priority Data
Nov. 6, 2014 (KR) .................... 10-2014-0153973
Nov. 6, 2015 (KR) .................... 10-2015-0156170

(51) Int. Cl.
*H01L 35/24* (2006.01)
*H01L 51/00* (2006.01)
(Continued)

(52) U.S. Cl.
CPC ............ *C09K 11/06* (2013.01); *C09K 11/025* (2013.01); *H01G 9/2059* (2013.01);
(Continued)

(58) Field of Classification Search
CPC .... C09K 11/06; C09K 11/025; H01G 9/2059; H01L 51/0077
(Continued)

(56) References Cited

FOREIGN PATENT DOCUMENTS

| KR | 10-2001-0015084 | 2/2001 |
|----|-----------------|--------|
| KR | 10-2010-0034003 | 3/2010 |
| KR | 10-2013-0055940 | 5/2013 |

OTHER PUBLICATIONS

Jeffrey Urban. Synthesis of SingleCrystalline Perovskite Nanorods Composed of Barium Titanate and Strontium Titanate, 2002, American Chemical society, vol. 124 No. 7, pp. 1185-1186.*
(Continued)

*Primary Examiner* — David S Blum
(74) *Attorney, Agent, or Firm* — LEX IP Meister, PLLC

(57) ABSTRACT

Provided are an organic/inorganic/hybrid perovskite nanocrystal particle light-emitter having a gradient structure, a method of producing the same, and a light emitting element using the same. The organic/inorganic/hybrid perovskite nanocrystal particle light-emitter having a gradient structure includes an organic/inorganic/hybrid perovskite nanocrystal which is dispersible in an organic solvent, wherein the nanocrystal has a gradient composition in which a composition is changed from the center thereof to the outside. Therefore, the gradual change in the content in the nanocrystal may be used to uniformly adjust a fraction in the nanocrystal, to reduce surface oxidation, and to improve exciton confinement in the perovskite present in large quantities inside the nanocrystal, and thus light luminescence efficiency may be improved and durability and stability may be increased.

27 Claims, 7 Drawing Sheets

(51) Int. Cl.
    *H01L 21/00*     (2006.01)
    *C09K 11/06*     (2006.01)
    *C09K 11/02*     (2006.01)
    *H01G 9/20*     (2006.01)
    *H01L 51/50*     (2006.01)
    *H01L 51/56*     (2006.01)
    *H01L 51/42*     (2006.01)

(52) U.S. Cl.
    CPC .... *H01L 51/0077* (2013.01); *C09K 2211/188* (2013.01); *H01L 51/0003* (2013.01); *H01L 51/0026* (2013.01); *H01L 51/422* (2013.01); *H01L 51/5032* (2013.01); *H01L 51/56* (2013.01); *H01L 2251/5346* (2013.01)

(58) Field of Classification Search
    USPC ........................................ 257/40; 438/24, 76
    See application file for complete search history.

(56) References Cited

OTHER PUBLICATIONS

Stoumpos. C. C. et al., "Crystal Growth of the Perovskite Semiconductor CsPbBr3: A New Material for High-Energy Radiation Detection", Crystal Growth & Design , 2013, vol. 13, No. 7, pp. 2722-2727.
Schmidt, L.C. et al., "Nontemplate Synthesis of CH3NH3PbBr3 Perovskite Nanoparticles", Journal of the American Chemical Society, 2014, vol. 136, No. 3, pp. 850-853, Jan. 3, 2014.
KIPO, International Search Report, Application No. of PCT/KR2015/011962, dated Mar. 10, 2016.

* cited by examiner

PEROVSKITE NANOCRYSTAL PARTICLE LIGHT-EMITTER WHOSE CONTENT IS CHANGED, METHOD OF PRODUCING THE SAME, AND LIGHT EMITTING ELEMENT USING THE SAME

TECHNICAL FIELD

The present invention relates to a light-emitter and a light emitting element using the same, and more particularly, to a perovskite or inorganic metal halide perovskite nanocrystal colloidal particle light-emitter whose content is changed, a method of producing the same, and a light emitting element using the same.

BACKGROUND ART

Currently, a major trend in the display market is moving from existing high-efficiency and high-resolution oriented displays to the emotional image-quality displays having high color purity for demonstration of natural colors. From this viewpoint, currently, organic light-emitter based organic light emitting diode (OLED) elements have achieved rapid progress, and inorganic quantum dot light emitting diodes (LEDs) with improved color purity have been actively researched and developed as alternatives. However, both an organic light-emitter and an inorganic quantum dot light-emitter have inherent limitations in terms of materials.

The existing organic light-emitter has high efficiency, but has a wide spectrum and poor color purity. The inorganic colloidal quantum dot light-emitter has been known to have good color purity. However, there is a problem in that color purity is reduced because it is difficult to control a size of a quantum dot uniformly as the color approaches the blue color because of size distribution. Furthermore, because inorganic quantum dots have a very deep valence band, there is a problem in that hole injection barriers in an organic hole injection layer are too large to inject holes. Also, there is a disadvantage in that the two light-emitters are expensive. Therefore, there is a need for a new type of organic/inorganic/hybrid light-emitter that compensates for the disadvantages of the organic and inorganic light-emitters and maintains advantages thereof.

Since hybrid materials composed of organics and inorganics have both advantages of organic materials such as low manufacturing cost, simple producing and element manufacturing processes, and easily controllable optical and electrical properties and advantages of inorganic materials such as high charge mobility and mechanical and thermal stability, the organic/inorganic/hybrid materials have been spotlighted both academically and industrially.

Since organic/inorganic/hybrid perovskite materials, hereafter "perovskites", among the organic/inorganic/hybrid materials have high color purity, simple color adjustment, and low synthesis cost, the possibility of development as light-emitters is very high. Since the perovskite materials can have a layered structure, in which a two-dimensional (2D) plane of an inorganic material is interposed between 2D planes of an organic material, and a dielectric constant difference between an inorganic material and an organic material is large ($\varepsilon_{organic} \approx 2.4$, $\varepsilon_{inorganic} \approx 6.1$), electron-hole pairs (or excitons) are confined to the inorganic plane. Therefore, the perovskite materials having high color purity (full width at half maximum (FWHM) $\approx 20$ nm) are formed.

As a material having a perovskite ($ABX_3$) structure in the related art, there is an inorganic metal oxide.

Such an inorganic metal oxide is generally oxide, and is a material in which cations of metals (such as an alkali metal, an alkaline earth metal, a transition metal, a lanthanide, and the like) such as Ti, Sr, Ca, Cs, Ba, Y, Gd, La, Fe, Mn, and the like having different sizes are located at A and B sites, anions of oxygen are located at an X site, and the cations of metals at the B site are combined with the anions of oxygen at the X site as a corner-sharing octahedron form of 6-fold coordination. As examples of the inorganic metal oxide, there are $SrFeO_3$, $LaMnO_3$, $CaFeO_3$, and the like.

On the other hand, in the halide perovskite, cations of organic ammonium halide ($RNH_3$) are located at an A site and halides (Cl, Br, and I) are located at an X site in an $ABX_3$ structure to form an organic metal halide perovskite material, and thus a composition of the organic metal halide perovskite material is completely different from that of an inorganic metal oxide perovskite material.

Also, properties of the materials are based on the difference of such constituent materials. The inorganic metal oxide perovskite has representative properties such as superconductivity, ferroelectricity, colossal magnetoresistance, and the like. Therefore, the inorganic metal oxide perovskite is generally applied to sensors, fuel cells, memory devices, and the like, and research thereon has been conducted. For example, yttrium barium copper oxide has superconductivity or an insulation property according to oxygen content.

On the other hand, since a perovskite (or an organic metal halide perovskite) has a structure, in which an organic plane (or an alkali metal plane) and an inorganic plane can be alternately stacked, which is similar to a lamellar structure, excitons may be confined to the inorganic plane. Therefore, an ideal light-emitter which emits light having very high color purity may be formed by a crystalline structure itself rather than a size of the material in essence.

Even in the perovskites, since light emission occurs in organic ammonium cation when the organic ammonium contains a chromophore (mainly including a conjugated structure) having a smaller bandgap than that of a crystalline structure of a central metal and halogen ($BX_3$), light having high color purity cannot be emitted, a FWHM of the light emission spectrum becomes wider than 50 nm, and thus the hybrid perovskite becomes unsuitable as a light emitting layer. Therefore, in this case, this type of organic-inorganic hybrid perovskites is not very suitable for a high color purity light-emitter emphasized in the present invention. Therefore, in order to make a high color purity light-emitter, it is important that organic ammonium as cation does not contain a chromophore and light emission occurs in an inorganic material lattice consisting of a central metal and a halogen element. That is, the present invention focuses on the development of a high color purity and high efficiency light-emitter in which light emission occurs in an inorganic material lattice. For example, in Korean Patent Application Publication No. 10-2001-0015084 (Published on Feb. 26, 2001), an electroluminescent element in which a dye-containing organic-inorganic hybrid material is formed in the form of a thin film rather than particles and is used as a light emitting layer is disclosed, but light emission originated from the emitting-dye itself not in a perovskite lattice structure.

However, since the perovskite has a small exciton binding energy, there is a fundamental problem in that, at low temperature, light can be emitted but, at room temperature, excitons cannot lead to light emission due to thermal ionization and delocalization of a charge carrier, are separated into free charges, and disappear. Also, when the free charges are recombined to form excitons, there is a problem in that the excitons are destroyed by a layer having a high conductivity around the excitons, so that light emission does not occur. Therefore, it is necessary to prevent quenching of the excitons in order to increase light luminescence efficiency and luminance of a perovskite based LED.

DISCLOSURE

Technical Problem

The present invention is directed to providing a nanocrystal particle light-emitter having a light luminescence efficiency, durability, and stability which are improved by synthesizing a perovskite or an inorganic metal halide perovskite in a form of nanocrystal instead of a thin film in order to prevent thermal ionization, delocalization of charge carriers, and quenching of excitons, and a light emitting element using the same.

Furthermore, the present invention is directed to providing a nanocrystal particle light-emitter having an improved luminescence efficiency and durability by forming a gradient-alloy type perovskite nanocrystals or inorganic metal halide perovskite nanocrystals with spatial changes in the composition, and a light emitting element using the same.

Technical Solution

One aspect of the present invention provides a perovskite nanocrystal colloidal particle light-emitter having a gradient structure. The perovskite nanocrystal particle light-emitter having a gradient structure includes a perovskite nanocrystal structure which is dispersible in an organic solvent or material, wherein the nanocrystal structure has a gradient composition in which a composition is changed from the center thereof to the outside.

The organic solvent may include a polar solvent or a non-polar solvent, wherein the polar solvent may include dimethylformamide, gamma butyrolactone, N-methylpyrrolidone, dimethyl sulfoxide or isopropyl alcohol, and the non-polar solvent may include dichloroethylene, trichlorethylene, chloroform, chlorobenzene, dichlorobenzene, styrene, xylene, toluene, or cyclohexene.

The perovskite nanocrystal particle may have a spherical, cylindrical, elliptical pillar, polyprism, or polygonal pillar shape.

A size of the nanocrystal particle may range from 1 nm to 900 nm.

A bandgap energy of the perovskite nanocrystal particle may be determined by a crystalline structure without depending on the size of the particle.

The perovskite may have a structure of $ABX_{3-h}X'_h$, $A_2BX_{4-l}X'_l$ or $ABX_{4-k}X'_k$, wherein A may be an organic ammonium material, B is a metal material, X is Br, X' is Cl, h is real number of 0 to 3, l and k are real numbers of 0 to 4 and values of m, l, and k may be increased from a center of the nanocrystal structure to the outside.

The A may be $(CH_3NH_3)_n$, $(C_mH_{2m+1})_xNH_{4-x}$, $((C_mH_{2m+1})_yNH_{3-y})(CH_2)_zNH_3$, $(CF_3NH_3)$, $(C_mF_{2m+1})_xNH_{4-x}$, $((C_mF_{2m+1})_yNH_{3-y})(CH_2)_zNH_3$, $(CH(NH_2)_2)$, $(C_mH_{2m+1})(C(NH_2)_2)$, $(C_mF_{2m+1})(C(NH_2)_2)$, or a combination thereof (where n, m, x, y and z are integers greater than 1 or equal to 1), and the B may be a bivalent transition metal, an organic molecule, a rare-earth metal, an alkaline-earth metal, Pb, Sn, Ge, Ga, In, Al, Sb, Bi, Po, or a combination thereof.

The values of h, l, and k may be gradually increased from the center of the nanocrystal structure to the outside.

The values of h, l, and k may be increased stepwise from the center of the nanocrystal structure to the outside.

The perovskite nanocrystal particle light-emitter having a gradient structure may further include a plurality of organic ligands or inorganic ligands configured to surround the perovskite nanocrystal structure.

The organic ligands may include an alkyl halide. An alkyl structure of the alkyl halide may include an acyclic alkyl having a structure of $C_nH_{2n+1}$, a primary alcohol, a secondary alcohol, a tertiary alcohol, an alkylamine, p-substituted aniline, phenyl ammonium, or fluorine ammonium.

Another aspect of the present invention provides a method of producing a perovskite nanocrystal particle light-emitter having a gradient structure. The method includes preparing a perovskite nanocrystal particle having a core-shell structure in which a composition of a core is different from a composition of a shell, and forming the perovskite nanocrystal particle having a core-shell structure so as to have a gradient composition through interdiffusion by performing heat treatment thereon.

The preparing of the perovskite nanocrystal particle having a core-shell structure may include preparing a first solution in which a first perovskite is dissolved in a polar solvent and a second solution in which an alkyl halide surfactant is dissolved in a non-polar solvent, forming a core including a first perovskite nanocrystal by mixing the first solution with the second solution, and forming a shell, which includes a second perovskite nanocrystal and surrounds the core, by adding a third solution, in which a second perovskite having a larger bandgap than that of the first perovskite is dissolved, to the second solution.

The first perovskite may have a structure of $ABX_3$, $A_2BX_4$ or $ABX_4$ and the second perovskite may have a structure of $ABX'_3$, $A_2BX'_4$ or $ABX'_4$, wherein A may be an organic ammonium or metal material, B may be a metal or organic ammonium, X may be Br, and X' may be Cl.

The preparing of the perovskite nanocrystal particle having a core-shell structure may include preparing a first solution in which a first perovskite is dissolved in a polar solvent and a second solution in which an alkyl halide surfactant is dissolved in a non-polar solvent, forming a core including a first perovskite nanocrystal by mixing the first solution with the second solution, and forming a shell, which has a larger bandgap than that of the core and surrounds the core, by adding an organic ammonium halide solution to the second solution and then stirring.

The preparing of the perovskite nanocrystal particle having a core-shell structure may include preparing a first solution in which a first perovskite is dissolved in a polar solvent and a second solution in which an alkyl halide surfactant is dissolved in a non-polar solvent, forming a core including a first perovskite nanocrystal by mixing the first solution with the second solution, thermally decomposing a surface of the core by performing heat treatment on the second solution, and forming a shell, which has a larger bandgap than that of the core and surrounds the core, by adding an organic ammonium halide solution to the heat-treated second solution.

Still another aspect of the present invention provides a method of producing a perovskite nanocrystal particle light-emitter having a gradient structure. The method includes preparing a first solution in which a first perovskite is dissolved in a polar solvent and a second solution in which an alkyl halide surfactant is dissolved in a non-polar solvent, forming a core including a first perovskite nanocrystal by mixing the first solution with the second solution, and forming a shell, which has a larger bandgap than that of the core and surrounds the core, by adding a third solution, in which a second perovskite is dissolved, to the second solution while changing a composition of the second perovskite.

The second perovskite may have a structure of $ABX_{3-h}X'_h$, $A_2BX_{4-l}X'_l$, or $ABX_{4-k}X'_k$, wherein A may be an organic ammonium material, B may be a metal material, X may be Br, X' may be Cl, h is real number of 0 to 3, and l and k are real numbers of 0 to 4 and the third solution in which the second perovskite is dissolved may be added to the second solution while increasing a value of h, l, or k.

Yet another aspect of the present invention provides a light emitting element. The light emitting element includes a first electrode, a second electrode, and a light emitting layer, which is located between the first electrode and the second electrode and includes the perovskite nanocrystal particle light-emitter having a gradient structure.

Yet another aspect of the present invention provides an inorganic metal halide perovskite nanocrystal particle light-emitter having a gradient structure. The inorganic metal halide perovskite nanocrystal particle light-emitter having a gradient structure includes an inorganic metal halide perovskite nanocrystal structure which is dispersible in an organic solvent or organics, wherein the nanocrystal structure has a gradient composition in which a composition is changed from the center thereof to the outside.

The inorganic metal halide perovskite may have a structure of $ABX_{3-h}X'_h$, $A_2BX_{4-l}X'_l$, or $ABX_{4-k}X'_k$, wherein A may be an alkali metal, B may be a metal or ammonium material, X may be Br, X' may be Cl, h is real number of 0 to 3, and l and k are real numbers of 0 to 4 and values of m, l, and k may be increased from a center of the nanocrystal structure to the outside.

The A may be Na, K, Rb, Cs, or Fr, and the B may be a bivalent transition metal, a rare-earth metal, an alkaline-earth metal, $NH_4^+$, Pb, Sn, Ge, Ga, In, Al, Sb, Bi, Po, or a combination thereof.

Values of h, l, and k may be gradually increased from the center of the nanocrystal structure to the outside.

The values of h, l, and k may be increased stepwise from the center of the nanocrystal structure to the outside.

The inorganic metal halide perovskite nanocrystal particle light-emitter having a gradient structure may further include a plurality of organic or inorganic ligands configured to surround the perovskite nanocrystal structure.

Yet another aspect of the present invention provides a solar cell. The solar cell includes a first electrode, a second electrode, and a photoactive layer, which is located between the first electrode and the second electrode and includes the perovskite nanocrystal particle light-emitter having a gradient structure or the inorganic metal halide perovskite nanocrystal particle light-emitter having a gradient structure in composition.

Advantageous Effects

In a nanocrystal colloidal particle light-emitter including an organic/inorganic/hybrid perovskite (or an inorganic metal halide perovskite) nanocrystal according to the present invention, a perovskite having a crystalline structure in which a face centered cubic (FCC) structure and a body centered cubic (BCC) structure are combined can be formed in the nanocrystal particle light-emitter, a lamellar (or layered) structure in which an organic plane and an inorganic plane are alternately stacked can also be formed, and excitons can be confined to the inorganic plane to show high color purity.

Also, an exciton diffusion length can be reduced and an exciton binding energy can be increased in a nanocrystal within a size of 900 nm, and thus exciton destruction due to thermal ionization and delocalization of a charge carrier can be prevented and light luminescence efficiency can be obtained at a high room temperature.

Also, a bandgap energy of the perovskite nanocrystal particle is determined by a crystalline structure without depending on the size of the particle.

Also, a two-dimensional (2D) perovskite is synthesized as a nanocrystal in comparison to a three-dimensional (3D) perovskite, and thus an exciton binding energy can be increased not only to further improve the light luminescence efficiency but also to increase durability and stability.

Also, a perovskite or an inorganic metal halide perovskite nanocrystal is made in a gradient-alloy type, and thus a content of perovskite present in large quantities outside the nanocrystal and a content of perovskite present in large quantities inside the nanocrystal can be gradually changed. Such gradual change in the content inside the nanocrystal can be used to uniformly adjust a fraction in the nanocrystal, to reduce surface oxidation, and to improve exciton confinement in the perovskite existing in large quantities inside the nanocrystal, and thus luminescence efficiency can be improved and durability and stability can also be increased.

Technical effects of the present invention are not limited to the above-described effects and other unmentioned technical effects may be clearly understood by those skilled in the art from the following descriptions.

MODES OF THE INVENTION

Figure 1:
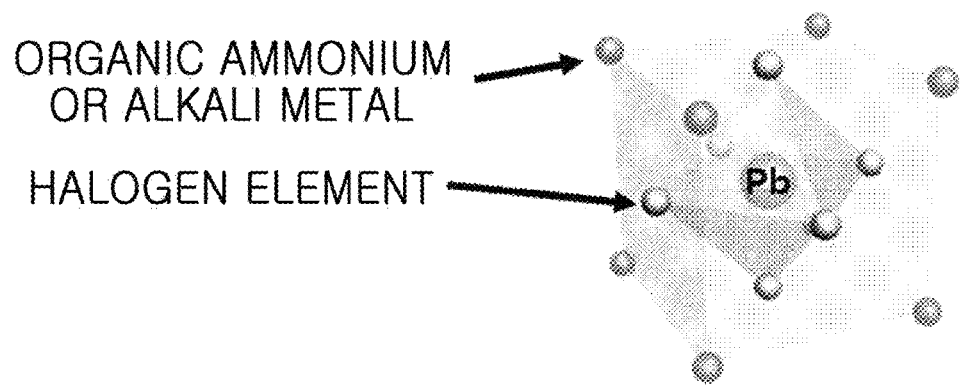
FIG. 1 is a schematic diagram of structures of perovskite nanocrystals according to one embodiment of the present invention.

Hereinafter, embodiments of the present invention will be described in detail with reference to the accompanying drawings.

While the present invention can be modified in various ways and take on various alternative forms, specific embodiments thereof are shown in the drawings and described in detail below as examples. However, there is no intent to limit the invention to the particular forms disclosed. On the contrary, the present invention is to cover all modifications, equivalents, and alternatives falling within the spirit and scope of the present invention as defined by the appended claims.

It will be understood that when an element such as a layer, an area, or a substrate is referred to as being present "on" another element, it can be directly present on the other element or an intervening element can be present.

Although the terms "first," "second," etc. can be used to describe various elements, components, areas, layers, and/or regions, it will be understood that such elements, components, areas, layers, and/or regions are not limited to these terms.

FIG. 1 is a schematic diagram of structures of perovskite nanocrystals according to one embodiment of the present invention.

In FIG. 1, a structure of a perovskite nanocrystal and a structure of an inorganic metal halide perovskite nanocrystal are illustrated together.

Referring to FIG. 1, the halide perovskite nanocrystal including organic ligands is formed to have a structure in which a central metal is in the center thereof, six inorganic halide materials (X) are located on all surfaces of a hexahedron in a face centered cubic (FCC) structure, and eight organic ammonium (OA) are located at all vertexes of a hexahedron in a body centered cubic (BCC) structure. In this case, Pb is illustrated as an example of the central metal.

Also, the inorganic metal halide perovskite nanocrystal is formed to have a structure in which a central metal is in the center thereof, six inorganic halide materials (X) are located on all surfaces of a hexahedron in a FCC structure, and eight alkali metals are located at all vertexes of a hexahedron in a BCC structure. In this case, Pb is illustrated as an example of the central metal.

In this case, all the surfaces of the hexahedron form 90°, and the hexahedron includes a cubic structure in which a horizontal length, a vertical length, and a height are the same, and a tetragonal structure in which a horizontal length and a vertical length are the same and a height is different therefrom.

Therefore, a two-dimensional (2D) structure according to the present invention is a structure of a perovskite nanocrystal in which a central metal is in the center thereof, six inorganic halide materials are located on all surfaces of a hexahedron in a FCC structure, and eight organic ammonium are located at all vertexes of a hexahedron in a BCC structure, and is defined as a structure in which a horizontal length and a vertical length are the same and a height is at least 1.5 times longer than the horizontal length and vertical length.

A perovskite nanocrystal particle light-emitter having a gradient structure according to one embodiment of the present invention will be described.

Figure 2:
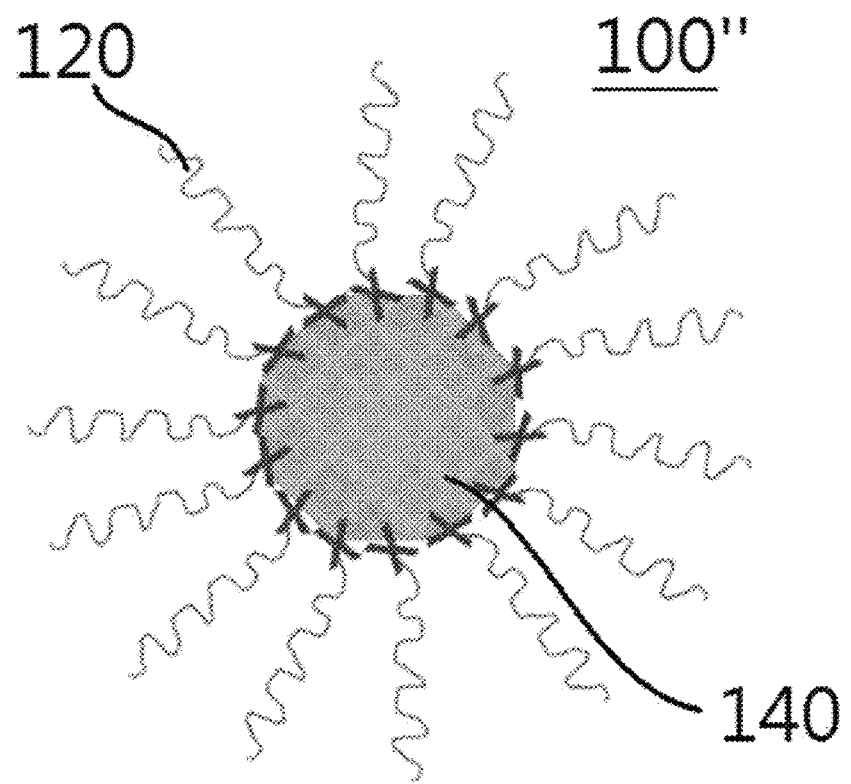
FIG. 2 is a schematic diagram illustrating a perovskite nanocrystal particle light-emitter having a gradient structure according to one embodiment of the present invention

FIG. 2 is a schematic diagram illustrating the perovskite nanocrystal colloidal particle light-emitter having a gradient structure according to the embodiment of the present invention.

Referring to FIG. 2, a perovskite nanocrystal colloidal particle light-emitter 100" having a gradient structure according to the embodiment of the present invention includes a perovskite nanocrystal structure 140 which is dispersible in an organic solvent. The nanocrystal structure 140 has a gradient composition in which a composition is changed from the center thereof to the outside. In this case, the organic solvent may be a polar solvent or a non-polar solvent. For example, the polar solvent may include dimethylformamide, gamma butyrolactone, N-methylpyrrolidone, dimethyl sulfoxide or isopropyl alcohol, and the non-polar solvent may include dichloroethylene, trichlorethylene, chloroform, chlorobenzene, dichlorobenzene, styrene, xylene, toluene, cyclohexene.

Also, in this case, the nanocrystal particle may have a spherical, cylindrical, elliptical pillar, or polygonal pillar shape.

Also, a size of the nanocrystal particle may range from 1 nm to 900 nm. Meanwhile, in this case, the size of the nanocrystal particle refers to a size without considering a length of a ligand to be described below, that is, a size of the remaining portion excluding the ligand.

For example, when the nanocrystal particle has a spherical shape, a diameter of the nanocrystal particle may range from 1 nm to 900 nm.

Also, in this case, the perovskite may have a structure of $ABX_{3-h}X'_h$, $A_2BX_{4-l}X'_l$, or $ABX_{4-k}X'_k$, wherein A may be an organic ammonium material, B may be a metal material, X may be Br, X' may be Cl, h is real number of 0 to 3, and l and k are real numbers of 0 to 4. Also, values of m, l, and k are increased from the center of the nanocrystal structure 140 to the outside.

Therefore, the perovskite structure becomes a structure in which an energy bandgap is increased from the center of the nanocrystal structure 140 to the outside.

The A may be $(CH_3NH_3)_n$, $(C_mH_{2m+1})_xNa_{4-x}$, $((C_mH_{2m+1})_yNH_{3-y})(CH_2)_zNH_3$, $(CF_3NH_3)$, $(C_mF_{2m+1})_xNH_{4-x}$, $((C_mF_{2m+1})_yNH_{3-y})(CH_2)_zNH_3$, $(CH(NH_2)_2)$, $(C_mH_{2m+1})(C(NH_2)_2)$, $(C_mF_{2m+1})(C(NH_2)_2)$ metal, or a combination thereof (where n, m, x, y and z are integers greater than 1 or equal to 1), and the B may be a bivalent transition metal, a molecule, a rare-earth metal, an alkaline-earth metal, Pb, Sn, Ge, Ga, In, Al, Sb, Bi, Po, or a combination thereof.

Meanwhile, the values of h, l, and k may be gradually increased from the center of the nanocrystal structure 140 to the outside. Therefore, an energy bandgap may be gradually increased according to such a composition change.

As another example, the values of h, l, and k may be increased stepwise from the center of the nanocrystal structure 140 to the outside. Therefore, an energy bandgap may be increased stepwise according to such a composition change.

Also, the perovskite nanocrystal particle light-emitter 100" may further include a plurality of organic ligands or inorganic ligands 120 which surround the perovskite nanocrystal structure 140. The organic ligands may include an alkyl halide. The alkyl halide may have a structure of alkyl-X. In this case, a halogen element corresponding to X may include Cl, Br, I, or the like. Also, in this case, the alkyl structure may include an acyclic alkyl having a structure of $C_nH_{2n+1}$, a primary alcohol, a secondary alcohol, or a tertiary alcohol having a structure of $C_nH_{2n+1}OH$ etc., an alkylamine (e.g., hexadecyl amine and 9-octadecenylamine 1-amino-9-octadecene ($C_{19}H_{37}N$)) having a structure of alkyl-N, p-substituted aniline, phenyl ammonium, or fluorine ammonium, but the present invention is not limited thereto.

Figure 3:
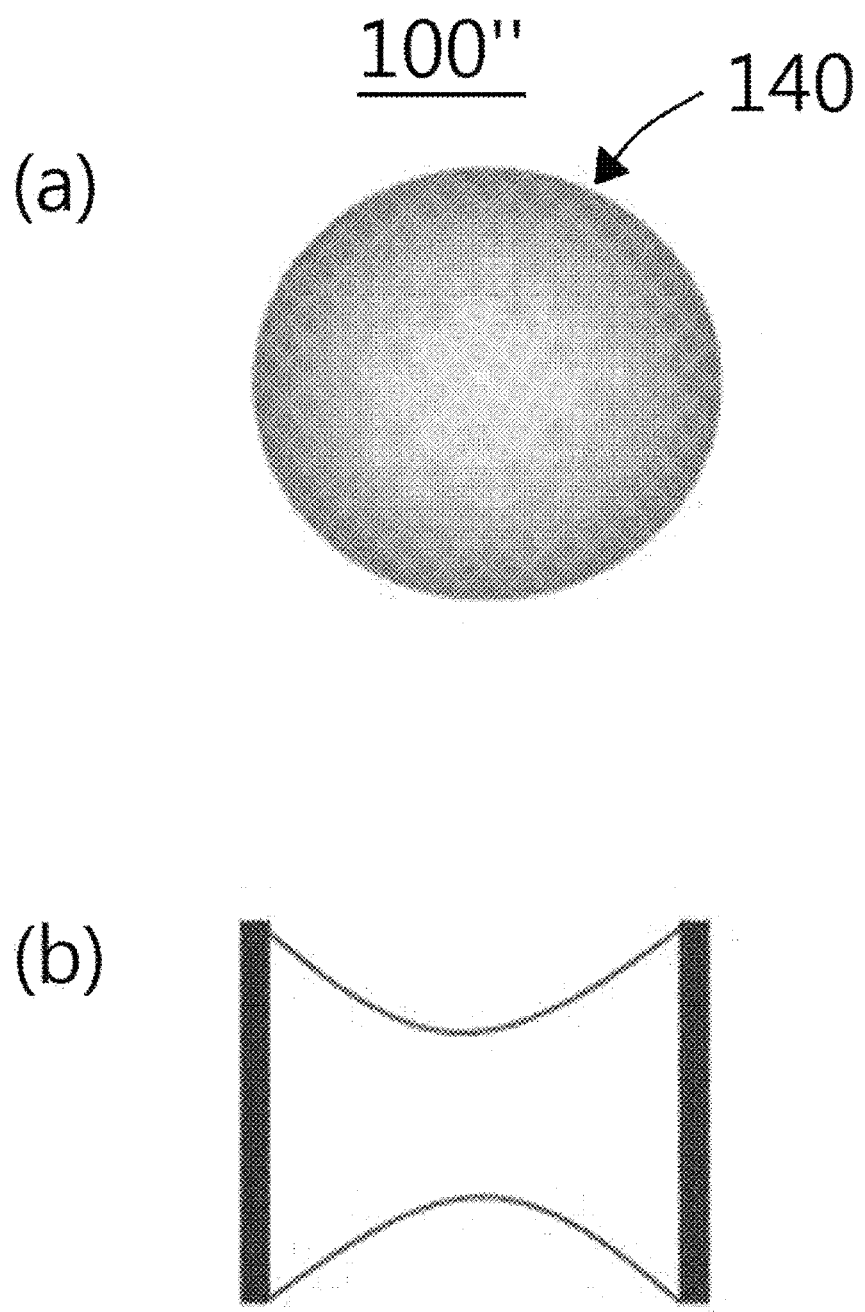
FIGS. 3A and 3B are a schematic diagram and a band diagram thereof illustrating a perovskite nanocrystal particle light-emitter or inorganic metal halide perovskite nanocrystal particle light-emitter having a gradient structure according to one embodiment of the present invention.

FIGS. 3A and 3B are a schematic diagram and a band diagram thereof illustrating a perovskite nanocrystal particle light-emitter or inorganic metal halide perovskite nanocrystal particle light-emitter having a gradient structure according to one embodiment of the present invention. In this case, the perovskite nanocrystal particle light-emitter is illustrated in FIG. 3A. Since it becomes an inorganic metal halide nanocrystal particle light-emitter when an inorganic metal halide perovskite is substituted for the perovskite in FIG. 3A, description thereof is the same.

Referring to FIG. 3A, it may be seen that a nanocrystal particle light-emitter 100″ according to the present invention is a perovskite nanocrystal or inorganic metal halide perovskite nanocrystal structure 140 having a gradient composition whose content is changed. In this case, referring to FIG. 3B, the nanocrystal particle light-emitter 100″ may be produced so that an energy bandgap is increased from the center of the perovskite nanocrystal structure or inorganic metal halide perovskite nanocrystal structure 140 to the outside by changing a composition of the material from the center thereof to the outside.

A method of producing a perovskite nanocrystal particle light-emitter having a gradient structure according to one embodiment of the present invention will be described.

The method of producing the perovskite nanocrystal particle light-emitter having a gradient structure according to the embodiment of the present invention will be described in detail with reference to FIGS. 4 to 6.

Figure 4:
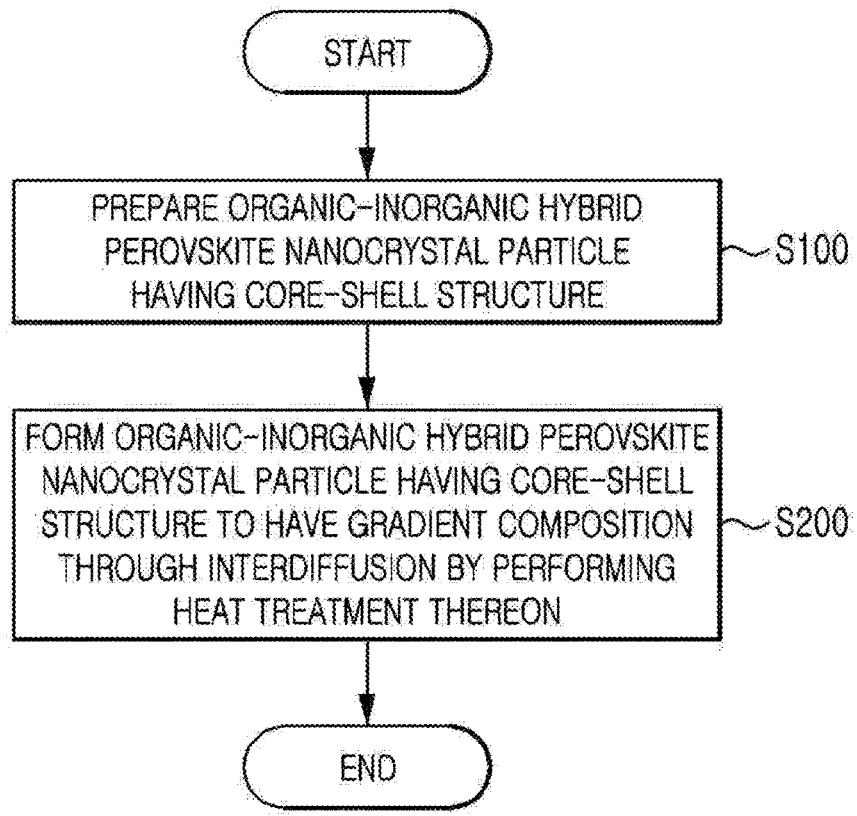
FIG. 4 is a flowchart illustrating a method of producing a perovskite nanocrystal particle light-emitter having a gradient structure according to one embodiment of the present invention.
Figure 5:
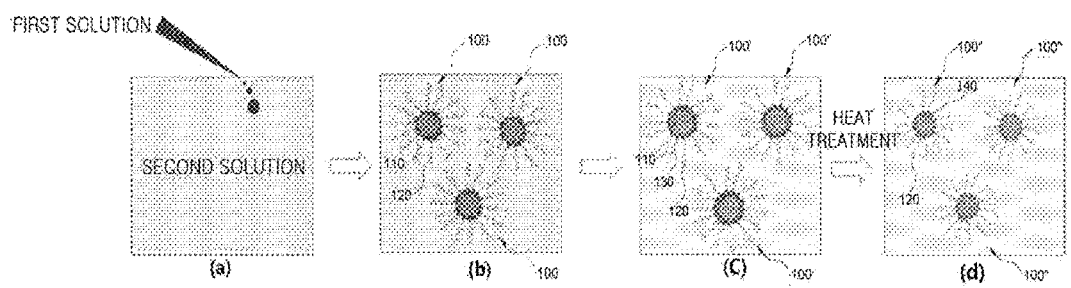
FIGS. 5A to 5D are schematic diagrams illustrating the method of producing the perovskite nanocrystal particle light-emitter having a gradient structure according to the embodiment of the present invention.

FIG. 4 is a flowchart illustrating the method of producing the perovskite nanocrystal particle light-emitter having a gradient structure according to the embodiment of the present invention.

Referring to FIG. 4, the method of producing the perovskite nanocrystal particle light-emitter having a gradient structure according to the embodiment of the present invention includes preparing a perovskite nanocrystal particle having a core-shell structure (S100) and forming the perovskite nanocrystal particle having a core-shell structure so as to have a gradient composition through interdiffusion by performing heat treatment thereon (S200).

First, a perovskite nanocrystal particle having a core-shell structure is prepared (S100).

As a first method, the preparing of the perovskite nanocrystal particle having a core-shell structure (S100) may include preparing a first solution in which a first perovskite is dissolved in a polar solvent and a second solution in which an alkyl halide surfactant is dissolved in an non-polar solvent, forming a core including a first perovskite nanocrystal by mixing the first solution with the second solution, and forming a shell, which includes a second perovskite nanocrystal and surrounds the core, by adding a third solution, in which a second perovskite having a larger bandgap than that of the first perovskite is dissolved, to the second solution.

More specifically, first, the first solution in which the first perovskite is dissolved in the polar solvent and the second solution in which the alkyl halide surfactant is dissolved in the non-polar solvent are prepared.

In this case, the polar solvent may include dimethylformamide, gamma butyrolactone N-methylpyrrolidone, dimethyl sulfoxide or iso-propyl alcohol, but the present invention is not limited thereto.

In this case, the first perovskite has a 2D structure or a three-dimensional (3D) structure.

For example, the perovskite having a 3D crystalline structure may have a structure of $ABX_3$. Also, the perovskite having a 2D crystalline structure may have a structure of $ABX_3$, $A_2BX_4$, or $ABX_4$.

Here, A is an organic ammonium material, B is a metal material, and X is a halogen element.

For example, the A may be $(CH_3NH_3)_n$, $(C_mH_{2m+1})_xNH_{4-x}$, $((C_mH_{2m+1})_yNH_{3-y})(CH_2)_zNH_3$, $(CF_3NH_3)$, $(C_mF_{2m+1})_xNH_{4-x}$, $((C_mF_{2m+1})_yNH_{3-y})(CH_2)_zNH_3$, $(CH(NH_2)_2)_2)$, $(C_mH_{2m+1})(C(NH_2)_2)$, $(C_mF_{2m+1})(C(NH_2)_2)$, Cs, or a combination thereof (where n, m, x, y and z are integers greater than 1 or equal to 1), the B may be a bivalent transition metal, a rare-earth metal, an alkaline-earth metal, Pb, Sn, Ge, Ga, In, Al, Sb, Bi, Po, or a combination thereof, and the X may be Cl, Br, I, or a combination thereof. In this case, the rare-earth metal may be, for example, Ge, Sn, Pb, Eu, or Yb. Also, the alkaline-earth metal may be, for example, Ca or Sr.

Meanwhile, the perovskite may be prepared by combining AX and $BX_2$ at a certain ratio. That is, the first solution may be formed by dissolving AX and $BX_2$ in the polar solvent at a certain ratio. For example, the first solution in which a perovskite having a structure of $A_2BX_4$ is dissolved may be prepared by dissolving AX and $BX_2$ in the polar solvent in a ratio of 2:1.

Also, in this case, a material having a 2D crystalline structure rather than a 3D crystalline structure is more preferably used as the perovskite.

This is because, in comparison to in a case in which the perovskite having a 3D structure is formed as a nanocrystal, in a case in which the perovskite having a 2D structure is formed as a nanocrystal, stacked inorganic and organic planes are clearly distinguished from each other and exciton confinement to the inorganic plane due to the organic plane becomes further certain. Therefore, an exciton binding energy may be increased to improve light luminescence efficiency, durability and stability may be increased, and high color purity may be shown.

Also, in this case, the non-polar solvent may include dichloroethylene, trichlorethylene, chloroform, chlorobenzene, dichlorobenzene, styrene, xylene, toluene, or cyclohexene, but the present invention is not limited thereto.

Also, the alkyl halide surfactant may have a structure of alkyl-X. In this case, a halogen element corresponding to X may include Cl, Br, or I. Also, in this case, the alkyl structure may include an acyclic alkyl having a structure of $C_nH_{2n+1}$, a primary alcohol, a secondary alcohol, or a tertiary alcohol having a structure of $C_nH_{2n+1}OH$, etc., an alkylamine (e.g., hexadecyl amine and 9-octadecenylamine 1-amino-9-octadecene ($C_{19}H_{37}N$)) having a structure of alkyl-N, p-substituted aniline, phenyl ammonium, or fluorine ammonium, but the present invention is not limited thereto.

Meanwhile, a carboxylic acid (COOH) surfactant may be used in place of the alkyl halide surfactant.

For example, the surfactant may include a carboxylic acid (COOH) such as 4,4′-azobis(4-cyanovaleric acid), acetic acid, 5-aminosalicylic acid, acrylic acid, L-aspentic acid, 6-bromohexanoic acid, bromoacetic acid, dichloro acetic acid, ethylenediaminetetraacetic acid, isobutyric acid, itaconic acid, maleic acid, r-maleimidobutyric acid, L-malic acid, 4-nitrobenzoic acid, 1-pyrenecarboxylic acid, or oleic acid, but the present invention is not limited thereto.

Then, the first solution is mixed with the second solution to form a core including a first perovskite nanocrystal.

The mixing of the first solution with the second solution to form the core preferably includes by dropwise mixing the first solution with the second solution. Also, in this case, the second solution may be stirred. For example, the core including the first perovskite nanocrystal may be synthesized by slowly dropwise adding the second solution, in which the perovskite is dissolved, to the strongly stirring second solution in which the alkyl halide surfactant is dissolved.

In this case, when the first solution is dropped and mixed with the second solution, the perovskite is precipitated from the second solution due to a difference in solubility. While a surface of the perovskite precipitated from the second solution is stabilized by the alkyl halide surfactant, a well-dispersed perovskite nanocrystal core is generated. Therefore, in this case, the generated perovskite nanocrystal core is surrounded by a plurality of organic or inorganic ligands (or compounds). Meanwhile, a size of the perovskite nanocrystal particle may be controlled by adjusting a length or shape factor of the alkyl halide surfactant. For example, the size of the perovskite nanocrystal particle may be controlled through shape factor adjustment, that is, a linear, tapered, or inverted triangular surfactant.

Also, the size of the perovskite nanocrystal particle generated in this manner may range from 1 nm to 900 nm. When the size of the perovskite nanocrystal particle is greater than 900 nm, there may be a fundamental problem in that excitons may not lead to light emission due to thermal ionization and delocalization of a charge carrier in the large nanocrystal, are separated into free charges, and disappear.

Then, a shell, which includes a second perovskite nanocrystal and surrounds the core, is formed by adding a third solution, in which a second perovskite having a larger bandgap than that of the first perovskite is dissolved, to the second solution.

For example, a shell, which includes a second perovskite nanocrystal and surrounds the core, may be formed by adding a third solution, in which a second perovskite having a larger bandgap than that of the first perovskite, to the second solution.

In this case, a material having a larger bandgap than that of the first perovskite is preferably selected as the second perovskite. The second perovskite may have a structure of $ABX_3$, $A_2BX_4$, or $ABX_4$. Here, A is an organic ammonium or metal material, B is a metal material, and X is a halogen element.

For example, the A may be $(CH_3NH_3)n$, $(C_mH_{2m+1})_xNH_{4-x}$, $((C_mH_{2m+1})_yNH_{3-y})(CH_2)_zNH_3$, $(CF_3NH_3)$, $(C_mF_{2m+1})_xNH_{4-x}$, $((C_mF_{2m+1})_yNH_{3-y})(CH_2)_zNH_3$, $(CH(NH_2)_2)$, $(C_mH_{2m+1})(C(NH_2)_2)$, $(C_mF_{2m+1})(C(NH_2)_2)$, or a combination thereof (where n, m, x, y, and z are integers greater than 1 or equal to 1), the B may be a bivalent transition metal, an ammonium, a rare-earth metal, an alkaline-earth metal, Pb, Sn, Ge, Ga, In, Al, Sb, Bi, Po, or a combination thereof, and the X may be Cl, Br, I, or a combination thereof. In this case, the rare-earth metal may be, for example, Ge, Sn, Pb, Eu, or Yb. Also, the alkaline-earth metal may be, for example, Ca or Sr.

For example, a shell including a second perovskite ($MAPbCl_3$) nanocrystal may be formed by slowly dropping or mixing a solution of a perovskite ($MAPbCl_3$) having a larger bandgap than of a perovskite ($MAPbBr_3$) solution which is generated through the above-described method (an inverse nano-emulsion or reprecipitation method) into $MAPbBr_3$ solution drop by drop while strongly stirring the $MAPbBr_3$ solution.

Since the core perovskite and the shell perovskite are mixed with each other to form an alloy form or stick to each other, a perovskite having a core-shell structure may be synthesized.

Therefore, a perovskite nanocrystal having a core-shell structure of $MAPbBr_3/MAPbCl_3$ may be formed.

Meanwhile, preferably, the first perovskite may have a structure of $ABX_3$, $A_2BX_4$, or $ABX_4$ and the second perovskite may have a structure of $ABX'_3$, $A_2BX'_4$, or $ABX'_4$, wherein A may be an organic ammonium material, B may be a metal material, X may be Br, and X' may be Cl.

As a second method, the preparing of the perovskite nanocrystal particle having a core-shell structure (S100) may include preparing a first solution in which a first perovskite is dissolved in a polar solvent and a second solution in which an alkyl halide surfactant is dissolved in a non-polar solvent, forming a core including a first perovskite nanocrystal by mixing the first solution with the second solution, and forming a shell, which has a larger bandgap than that of the core and surrounds the core, by adding an organic ammonium halide solution to the second solution and then stirring.

That is, the shell may be formed using the organic ammonium halide solution. That is, a large amount of the organic ammonium halide solution may be added to the second solution and the resulting mixed solution is then stirred to form the shell which has a larger bandgap than that of the core and surrounds the core.

For example, a shell may be formed by adding a MACl solution to the perovskite ($MAPbBr_3$) solution which is generated through the above-described method (an inverse nano-emulsion method by spraying), strongly stirring the resulting mixed solution, and converting $MAPbBr_3$ on the surface thereof into $MAPbBr_{3-x}Cl_x$ by excess MACl.

Therefore, a perovskite nanocrystal having a core-shell structure of $MAPbBr_3/MAPbBr_{3-x}Cl_x$ may be formed.

As a third method, the preparation of the perovskite nanocrystal particle having a core-shell structure (S100) may include preparing a first solution in which a first perovskite is dissolved in a polar solvent and a second solution in which an alkyl halide surfactant is dissolved in a non-polar solvent, forming a core including a first perovskite nanocrystal by mixing the first solution with the second solution, thermally decomposing a surface of the core by performing heat treatment on the second solution, and forming a shell, which has a larger bandgap than that of the core and surrounds the core, by adding an organic ammonium halide solution to the heat-treated second solution.

That is, the shell may be formed using a decomposition/alloying method. That is, after the surface of the core is thermally decomposed by performing heat treatment on the second solution, the shell, which has a larger bandgap than that of the core and surrounds the core, may be formed by adding the organic ammonium halide solution to the heat-treated second solution and by synthesizing the surface thereof again.

For example, after the perovskite ($MAPbBr_3$) solution which is generated through the above-described method (an inverse nano-emulsion method) is thermally decomposed so that the surface thereof is converted into $PbBr_2$ by performing heat treatment thereon, the shell may be formed by adding an MACl solution to the perovskite ($MAPbBr_3$) solution and by synthesizing the surface thereof again so that the surface becomes $MAPbBr_2Cl$.

That is, in this case, MAPbBr$_3$ may be thermally decomposed into MABr and PbBr$_2$ through the thermal decomposition.

Therefore, a perovskite nanocrystal having a core-shell structure of MAPbBr$_3$/MAPbBr$_2$Cl may be formed.

Then, the perovskite nanocrystal particle having a core-shell structure is formed so as to have a gradient composition through interdiffusion by performing heat treatment thereon (S200).

For example, after the perovskite having a core-shell structure is made to a solid solution state by performing annealing thereon at high temperature, the perovskite having a core-shell structure is formed so as to have a gradient composition through interdiffusion by performing heat treatment thereon.

For example, the heat treatment temperature may range from 100° C. to 150° C. The interdiffusion may be induced by performing annealing thereon at such a heat treatment temperature.

The above-described methods will be described once again with reference to a schematic diagram of FIGS. 5A to 5D.

FIGS. 5A to 5D are schematic diagrams illustrating the method of producing the perovskite nanocrystal particle light-emitter having a gradient structure according to the embodiment of the present invention.

Referring to FIGS. 5A and 5B, after a first solution in which a first perovskite is dissolved in a polar solvent and a second solution in which an alkyl halide surfactant is dissolved in a non-polar solvent are prepared, cores including a first perovskite nanocrystal are formed by mixing the first solution with the second solution.

Meanwhile, each of cores 110 is surrounded by a plurality of organic ligands 120 or inorganic ligands.

Referring to FIG. 5C, perovskite nanocrystals having a core-shell structure are formed through the above-described methods. In this case, each of perovskite nanocrystal particle light-emitters 100' having a core-shell structure includes a first perovskite nanocrystal core 110, a shell 120 including a second perovskite nanocrystal, which surrounds the nanocrystal core 110, and a plurality of organic ligands 140 which surround the shell 120.

Referring to FIG. 5D, perovskite nanocrystal particle light-emitters having a gradient structure may be formed through the above-described heat treatment. In this case, each of the perovskite nanocrystal particle light-emitters 100" having a gradient structure may include a perovskite nanocrystal structure 140 having a gradient composition and a plurality of organic ligands 140 which surround the nanocrystal structure 140.

Figure 6:
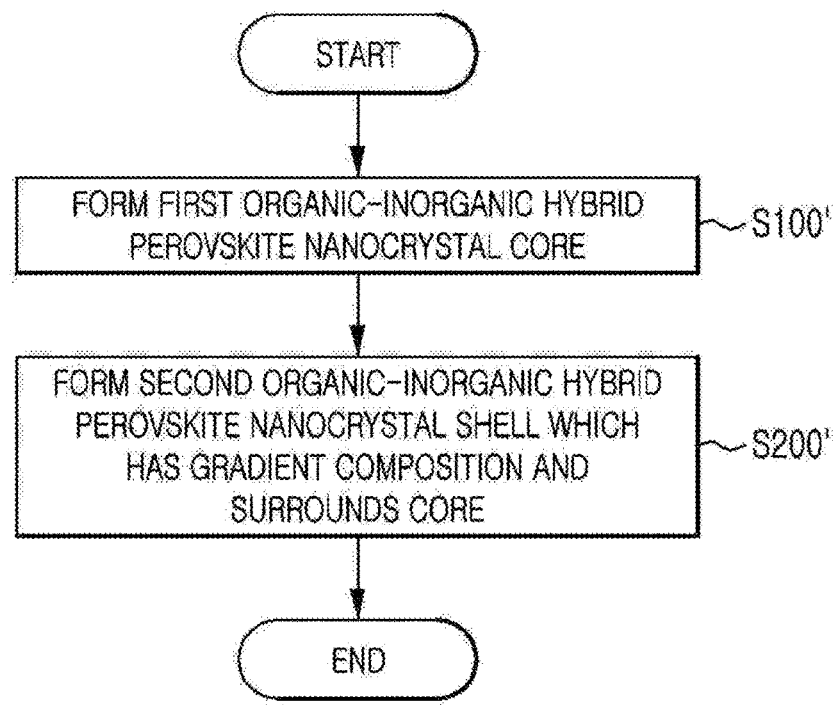
FIG. 6 is a flowchart illustrating a method of producing a perovskite nanocrystal particle light-emitter having a gradient structure according to another embodiment of the present invention.

FIG. 6 is a flowchart illustrating a method of producing a perovskite nanocrystal particle light-emitter having a gradient structure according to another embodiment of the present invention.

Referring to FIG. 6, the method of producing the perovskite nanocrystal particle light-emitter having a gradient structure according to the embodiment of the present invention includes forming a first perovskite nanocrystal core (S100') and forming a second perovskite nanocrystal shell which has a gradient composition and surrounds the core (S200').

First, a first perovskite nanocrystal core is formed (S100'). Since the method of forming the first perovskite nanocrystal core is the same as the above-described method of forming the nanocrystal core, detailed description thereof will be omitted.

Then, a second perovskite nanocrystal shell which has a gradient composition and surrounds the core is formed (S200').

A second perovskite may have a structure of ABX$_{3-h}$X'$_h$, A$_2$BX$_{4-l}$X'$_l$, or ABX$_{4-k}$X'$_k$, wherein A may be an organic ammonium material, B may be a metal material, X may be Br, X' may be Cl, h is real number of 0 to 3, and l and k are real numbers of 0 to 4.

Therefore, a third solution in which the second perovskite is dissolved may be added to a second solution while increasing a value of m, 1, or k.

That is, a solution in which a composition of ABX$_{3-h}$X'$_h$, A$_2$BX$_{4-l}$X'$_l$, or ABX$_{4-k}$X'$_k$ is controlled may be continuously dropped to form a shell whose composition is continuously changed.

An inorganic metal halide perovskite nanocrystal particle light-emitter having a gradient structure according to the embodiment of the present invention will be described.

The inorganic metal halide perovskite nanocrystal particle light-emitter having a gradient structure includes an inorganic metal halide perovskite nanocrystal structure which is dispersible in an organic solvent or material, and the nanocrystal structure has a gradient composition in which a composition is changed from the center thereof to the outside.

An inorganic metal halide perovskite may have a structure of ABX$_{3-h}$X'$_h$, A$_2$BX$_{4-l}$X'$_l$, or ABX$_{4-k}$X'$_k$, wherein A is an alkali metal, B is a metal material, X is Br, X' is Cl, and values of m, l, and k are increased from the center of the nanocrystal structure to the outside.

Also, the A may be Na, K, Rb, Cs, or Fr, and the B may be a bivalent transition metal, a rare-earth metal, an alkaline-earth metal, Pb, Sn, Ge, Ga, In, Al, Sb, Bi, Po, or a combination thereof.

Also, the values of h, l, and k are gradually increased from the center of the nanocrystal structure to the outside.

Also, the values of h, l, and k are increased stepwise from the center of the nanocrystal structure to the outside.

Also, the inorganic metal halide perovskite nanocrystal particle light-emitter having a gradient structure may further include a plurality of organic ligands or inorganic ligands which surround the perovskite nanocrystal structure.

The inorganic metal halide perovskite nanocrystal particle is the same as the inperovskite nanocrystal particle except that a material of an A site is an alkali metal in the former and an organic ammonium material in the latter. Therefore, since the inorganic metal halide perovskite nanocrystal particle having a gradient structure and a method of producing the same are the same as the perovskite nanocrystal particle light-emitter having a gradient structure and the method of producing the same, detailed description thereof will be omitted.

A light emitting element according to one embodiment of the present invention will be described.

The light emitting element according to the embodiment of the present invention may be an element using a light emitting layer including the above-described perovskite nanocrystal particle light-emitter having a gradient structure or inorganic metal halide perovskite nanocrystal particle light-emitter having a gradient structure. In this case, the perovskite nanocrystal particle light-emitter having a gradient structure or the inorganic metal halide perovskite nanocrystal particle light-emitter having a gradient structure may be produced by the above-described production methods.

For example, the light emitting element according to the present invention may include a first electrode, a second electrode, and a light emitting layer, which is located between the first electrode and the second electrode and includes the above-described perovskite nanocrystal particle light-emitter having a gradient structure or inorganic metal halide perovskite nanocrystal particle light-emitter having a gradient structure.

As another example, the light emitting element according to the present invention may be applied to a solar cell by using a photoactive layer including the above-described perovskite nanocrystal particle having a gradient structure or inorganic metal halide perovskite nanocrystal particle having a gradient structure. The solar cell may include a first electrode, a second electrode, and a photoactive layer, which is located between the first electrode and the second electrode and includes the above-described perovskite nanocrystal particle.

Production Example 1

A perovskite nanocrystal colloidal particle light-emitter having a 3D structure according to one embodiment of the present invention was formed. The perovskite nanocrystal particle light-emitter having a 3D structure was formed through an inverse nano-emulsion method.

Specifically, a first solution was prepared by dissolving a perovskite in a polar solvent. In this case, dimethylformamide was used as the polar solvent, and $CH_3NH_3PbBr_3$ was used as the perovskite. The $CH_3NH_3PbBr_3$ used herein was a mixture of $CH_3NH_3Br$ and $PbBr_2$ in a ratio of 1:1.

A second solution was prepared by dissolving an alkyl halide surfactant in a non-polar solvent. In this case, toluene was used as the non-polar solvent, and octadecylammonium bromide ($CH_3(CH_2)_{17}NH_3Br$) was used as the alkyl halide surfactant.

Then, the perovskite nanocrystal particle light-emitter having a 3D structure was formed by slowly dropwise adding the first solution to the strongly stirring second solution.

Then, a perovskite nanocrystal particle thin film was formed by spin-coating a glass substrate with the perovskite nanocrystal particle in a solution state.

In this case, a size of the formed perovskite nanocrystal particle is about 20 nm.

Production Example 2

Production Example 2 was performed in the same manner as Production Example 1 except that a perovskite nanocrystal particle light-emitter having a 3D structure according to one embodiment of the present invention was formed by using $CH_3(CH_2)_{13}NH_3Br$ as an alkyl halide surfactant.

In this case, a size of the formed perovskite nanocrystal particle is about 100 nm.

Production Example 3

Production Example 3 was performed in the same manner as Production Example 1 except that an a perovskite nanocrystal particle light-emitter having a 3D structure according to one embodiment of the present invention was formed by using $CH_3(CH_2)_{10}NH_3Br$ as an alkyl halide surfactant.

In this case, a size of the formed perovskite nanocrystal particle is about 300 nm.

Production Example 4

Production Example 4 was performed in the same manner as Production Example 1 except that a perovskite nanocrystal particle light-emitter having a 3D structure according to one embodiment of the present invention was formed by using $CH_3(CH_2)_7NH_3Br$ as an alkyl halide surfactant.

In this case, a size of the formed perovskite nanocrystal particle is about 500 nm.

Production Example 5

Production Example 5 was performed in the same manner as Production Example 1 except that a perovskite nanocrystal particle light-emitter having a 3D structure according to one embodiment of the present invention was formed by using $CH_3(CH_2)_4NH_3Br$ as an alkyl halide surfactant.

In this case, a size of the formed perovskite nanocrystal particle is about 700 nm.

Production Example 6

Production Example 6 was performed in the same manner as Production Example 1 except that a perovskite nanocrystal particle light-emitter having a 3D structure according to one embodiment of the present invention was formed by using $CH_3CH_2NH_3Br$ as an alkyl halide surfactant.

In this case, a size of the formed perovskite nanocrystal particle is about 800 nm.

Production Example 7

Production Example 7 was performed in the same manner as Production Example 1 except that a perovskite nanocrystal particle light-emitter having a 3D structure according to one embodiment of the present invention was formed by using $CH_3NH_3Br$ as an alkyl halide surfactant.

In this case, a size of the formed perovskite nanocrystal particle is about 900 nm.

Production Example 8

The perovskite nanocrystal according to Production Example 1 was used as a core. Also, a shell including a second perovskite nanocrystal ($MAPbCl_3$) was formed by slowly dropwise adding a second perovskite ($MAPbCl_3$) solution having a large bandgap to a solution containing the perovskite nanocrystal core.

Then, a perovskite nanocrystal particle light-emitter, whose content is changed, according to one embodiment of the present invention was formed by annealing at a temperature of 150° C.

Production Example 9

The perovskite nanocrystal according to Production Example 2 was used as a core. Also, a shell including a second perovskite nanocrystal ($MAPbCl_3$) was formed by slowly dropwise adding a second perovskite ($MAPbCl_3$) solution having a large bandgap to a solution containing the perovskite nanocrystal core.

Then, a perovskite nanocrystal particle light-emitter, whose content is changed, according to one embodiment of the present invention was formed by annealing at a temperature of 150° C.

Production Example 10

The perovskite nanocrystal according to Production Example 3 was used as a core. Also, a shell including a second perovskite nanocrystal ($MAPbCl_3$) was formed by slowly dropwise adding a second perovskite (MAPbCl$_3$) solution having a large bandgap to a solution containing the perovskite nanocrystal core.

Then, a perovskite nanocrystal particle light-emitter, whose content is changed, according to one embodiment of the present invention was formed by annealing at a temperature of 150° C.

Production Example 11

The perovskite nanocrystal according to Production Example 4 was used as a core. Also, a shell including a second perovskite nanocrystal (MAPbCl$_3$) was formed by slowly dropwise adding a second perovskite (MAPbCl$_3$) solution having a large bandgap to a solution containing the perovskite nanocrystal core.

Then, a perovskite nanocrystal particle light-emitter, whose content is changed, according to one embodiment of the present invention was formed by annealing at a temperature of 150° C.

Production Example 12

The perovskite nanocrystal according to Production Example 5 was used as a core. Also, a shell including a second perovskite nanocrystal (MAPbCl$_3$) was formed by slowly dropwise adding a second perovskite (MAPbCl$_3$) solution having a large bandgap to a solution containing the perovskite nanocrystal core.

Then, a perovskite nanocrystal particle light-emitter, whose content is changed, according to one embodiment of the present invention was formed by annealing at a temperature of 150° C.

Production Example 13

The perovskite nanocrystal according to Production Example 6 was used as a core. Also, a shell including a second perovskite nanocrystal (MAPbCl$_3$) was formed by slowly dropwise adding a second perovskite (MAPbCl$_3$) solution having a large bandgap into a solution containing the perovskite nanocrystal core.

Then, a perovskite nanocrystal particle light-emitter, whose content is changed, according to one embodiment of the present invention was formed by annealing at a temperature of 150° C.

Production Example 14

The perovskite nanocrystal according to Production Example 7 was used as a core. Also, a shell including a second perovskite nanocrystal (MAPbCl$_3$) was formed by slowly dropwise adding a second perovskite (MAPbCl$_3$) solution having a large bandgap to a solution containing the perovskite nanocrystal core.

Then, a perovskite nanocrystal particle light-emitter, whose content is changed, according to one embodiment of the present invention was formed by annealing at a temperature of 150° C.

Production Example 15

Production Example 15 was performed in the same manner as Production Example 8 except that (CH$_3$NH$_3$)$_2$PbBr$_4$ was used as a perovskite core. The (CH$_3$NH$_3$)$_2$PbBr$_4$ used herein was a mixture of CH$_3$NH$_3$Br and PbBr$_2$ in a ratio of 2:1.

In this case, the formed perovskite nanocrystal particle light-emitter whose content is changed emits light near ultraviolet or blue. An emission spectrum of the light is located at about 520 nm.

Production Example 16

Production Example 16 was performed in the same manner as Production Example 8 except that (CH$_3$NH$_3$)$_2$PbI$_4$ was used as a perovskite core. The (CH$_3$NH$_3$)$_2$PbI$_4$ used herein was a mixture of CH$_3$NH$_3$I and PbI$_2$ in a ratio of 2:1.

In this case, the formed perovskite nanocrystal particle whose content is changed emits light near ultraviolet or red. An emission spectrum of the light is located at about 780 nm.

Production Example 17

Production Example 17 was performed in the same manner as Production Example 8 except that (CH$_3$NH$_3$)$_2$PbCl$_x$Br$_{4-x}$ was used as a perovskite core. The (CH$_3$NH$_3$)$_2$PbCl$_x$Br$_{4-x}$ used herein was a mixture of CH$_3$NH$_3$Cl and PbBr$_2$ in a predetermined ratio.

In this case, an emission spectrum of light emitted from the formed perovskite nanocrystal particle whose content is changed is located between 380 nm and 520 nm.

Production Example 18

Production Example 18 was performed in the same manner as Production Example 8 except that (CH$_3$NH$_3$)$_2$PbI$_x$Br$_4$, was used as a perovskite core. The (CH$_3$NH$_3$)$_2$PbI$_x$Br$_{4-x}$ used herein was a mixture of CH$_3$NH$_3$I and PbBr$_2$ in a predetermined ratio.

In this case, an emission spectrum of light emitted from the formed perovskite nanocrystal particle whose content is changed is located between 520 nm and 780 nm.

Production Example 19

Production Example 19 was performed in the same manner as Production Example 8 except that (CH(NH$_2$)$_2$)$_2$PbI$_4$ was used as a perovskite core. The (CH(NH$_2$)$_2$)$_2$PbI$_4$ used herein was a mixture of CH(NH$_2$)$_2$I and PbI$_2$ in a ratio of 2:1.

In this case, an emission spectrum of light emitted from the formed perovskite nanocrystal particle whose content is changed is located at about 800 nm.

Production Example 20

Production Example 20 was performed in the same manner as Production Example 8 except that (CH$_3$NH$_3$)$_2$Pb$_x$Sn$_{1-x}$I$_4$ was used as a perovskite core. The (CH$_3$NH$_3$)$_2$Pb$_x$Sn$_{1-x}$I$_4$ used herein was a mixture of CH$_3$NH$_3$I and Pb$_x$Sn$_{1-x}$I$_2$ in a ratio of 2:1.

In this case, an emission spectrum of light emitted from the formed perovskite nanocrystal particle whose content is changed is located between 820 nm and 1120 nm.

Production Example 21

Production Example 21 was performed in the same manner as Production Example 8 except that (CH$_3$NH$_3$)$_2$Pb$_x$Sn$_{1-x}$Br$_4$ was used as a perovskite core. The (CH$_3$NH$_3$)$_2$Pb$_x$Sm$_{1-x}$Br$_4$ used herein was a mixture of CH$_3$NH$_3$Br and Pb$_x$Sn$_{1-x}$Br$_2$ in a ratio of 2:1.

In this case, an emission spectrum of light emitted from the formed perovskite nanocrystal particle whose content is changed is located between 540 nm and 650 nm.

Production Example 22

Production Example 22 was performed in the same manner as Production Example 8 except that $(CH_3NH_3)_2Pb_xSn_{1-x}Cl_4$ was used as a perovskite core. The $(CH_3NH_3)_2Pb_xSn_{1-x}Cl_4$ used herein was a mixture of $CH_3NH_3Cl$ and $Pb_xSn_{1-x}Cl_2$ in a ratio of 2:1.

In this case, an emission spectrum of light emitted from the formed perovskite nanocrystal particle whose content is changed is located between 400 nm and 460 nm.

Production Example 23

Production Example 23 was performed in the same manner as Production Example 8 except that $(C_4H_9NH_3)PbBr_4$ was used as a perovskite core. The $(C_4H_9NH_3)PbBr_4$ used herein was a mixture of $(C_4H_9NH_3)Br$ and $PbBr_2$ in a ratio of 2:1.

In this case, an emission spectrum of light emitted from the formed perovskite nanocrystal particle whose content is changed is located at about 411 nm.

Production Example 24

Production Example 24 was performed in the same manner as Production Example 8 except that $(C_5H_{11}NH_3)PbBr_4$ was used as a perovskite core. The $(C_5H_{11}NH_3)PbBr_4$ used herein was a mixture of $(C_5H_{11}NH_3)Br$ and $PbBr_2$ in a ratio of 2:1.

In this case, an emission spectrum of light emitted from the formed perovskite nanocrystal particle whose content is changed is located at about 405 nm.

Production Example 25

Production Example 25 was performed in the same manner as Production Example 8 except that $(C_7H_{15}NH_3)PbBr_4$ was used as a perovskite core. The $(C_7H_{15}NH_3)PbBr_4$ used herein was a mixture of $(C_7H_{15}NH_3)Br$ and $PbBr_2$ in a ratio of 2:1.

In this case, an emission spectrum of light emitted from the formed perovskite nanocrystal particle whose content is changed is located at about 401 nm.

Production Example 26

Production Example 26 was performed in the same manner as Production Example 8 except that $(C_{12}H_{25}NH_3)PbBr_4$ was used as a perovskite core. The $(C_{12}H_{25}NH_3)PbBr_4$ used herein was a mixture of $(C_{12}H_{25}NH_3)Br$ and $PbBr_2$ in a ratio of 2:1.

In this case, an emission spectrum of light emitted from the formed perovskite nanocrystal particle whose content is changed is located at about 388 nm.

Production Example 27

An inorganic metal halide perovskite nanocrystal particle light-emitter according to one embodiment of the present invention was formed. The inorganic metal halide perovskite nanocrystal particle light-emitter was formed through an inverse nano-emulsion or hot injection method.

Specifically, a third solution was prepared by adding cesium carbonate ($Cs_2CO_3$) and oleic acid to octadecene (ODE) which is a non-polar solvent and reacting them at high temperature. A fourth solution was prepared by adding $PbBr_2$, oleic acid, and oleylamine to a non-polar solvent and reacting them at high temperature (120° C.) for an hour.

Then, an inorganic halide perovskite ($CsPbBr_3$) nanocrystal particle light-emitter having a 3D structure was formed by slowly dropwise adding the third solution to the strongly stirring fourth solution.

Then, an inorganic halide perovskite nanocrystal particle thin film was formed by spin-coating a glass substrate with the inorganic metal halide perovskite nanocrystal particle in a state of being dispersed in such a solution.

In this case, a size of the formed inorganic metal halide perovskite nanocrystal particle is about 20 nm.

Production Example 28

The inorganic metal halide perovskite nanocrystal according to Production Example 27 was used as a core. Also, a shell including a second inorganic metal halide perovskite nanocrystal ($CsPbCl_3$) was formed by slowly dropwise adding a second inorganic metal halide perovskite ($CsPbCl_3$) solution having a large bandgap to a solution containing the inorganic metal halide perovskite nanocrystal core.

Then, an inorganic metal halide perovskite nanocrystal particle light-emitter, whose content is changed, according to one embodiment of the present invention was formed by annealing at a temperature of 150° C.

Production Example 29

A light emitting element according to one embodiment of the present invention was prepared.

First, an indium tin oxide (ITO) substrate (a glass substrate in which an ITO positive electrode is coated) was prepared, the ITO positive electrode was then spin-coated with PEDOT:PSS (AI4083 produced by Heraeus) which is a conductive material, and a hole injection layer having a thickness of 40 nm was formed by performing heat treatment thereon at a temperature of 150° C. for 30 minutes.

The hole injection layer was then spin-coated with a solution in which the perovskite nanocrystal particle whose content is changed according to Production Example 8 was dissolved, and a perovskite nanocrystal particle light emitting layer was formed by performing heat treatment thereon at a temperature of 80° C. for 20 minutes.

Then, an electron transport layer was formed by depositing 1,3,5-Tris(1-phenyl-1H-benzimidazol-2-yl)benzene (TPBI) having a thickness of 50 nm on the perovskite nanocrystal particle light emitting layer in a high vacuum of $1 \times 10^{-7}$ Torr or less, an electron injection layer was formed by depositing LiF having a thickness of 1 nm thereon, a negative electrode was formed by depositing aluminum having a thickness of 100 nm thereon, and a perovskite nanocrystal particle light emitting element was prepared.

Production Example 30

A solar cell according to one embodiment of the present invention was prepared.

First, an ITO substrate (a glass substrate in which an ITO positive electrode is coated) was prepared, the ITO positive electrode was then spin-coated with PEDOT:PSS (CLEVIOS PH produced by Heraeus) which is a conductive material, and a hole extraction layer having a thickness of 40 nm was formed by performing heat treatment thereon at a temperature of 150° C. for 30 minutes.

A photoactive layer was formed by mixing the perovskite nanocrystal particle having a gradient structure according to Production Example 1 with phenyl-$C_{61}$-butyric acid methyl ester (PCBM) and by coating the hole extraction layer with the resulting mixture, and a perovskite nanocrystal particle solar cell was formed by depositing Al having a thickness of 100 nm directly on the photoactive layer.

Comparative Example 1

A first solution was prepared by dissolving $CH_3NH_3PbBr_3$ in dimethylformamide which is a polar solvent.

Then, a $CH_3NH_3PbBr_3$ thin film was prepared by spin-coating a glass substrate with the first solution.

Comparative Example 2

A first solution was prepared by dissolving $CH_3NH_3PbCl_3$ in dimethylformamide which is a polar solvent.

Then, a $CH_3NH_3PbCl_3$ thin film was prepared by spin-coating a glass substrate with the first solution.

Experimental Example

Figure 7:
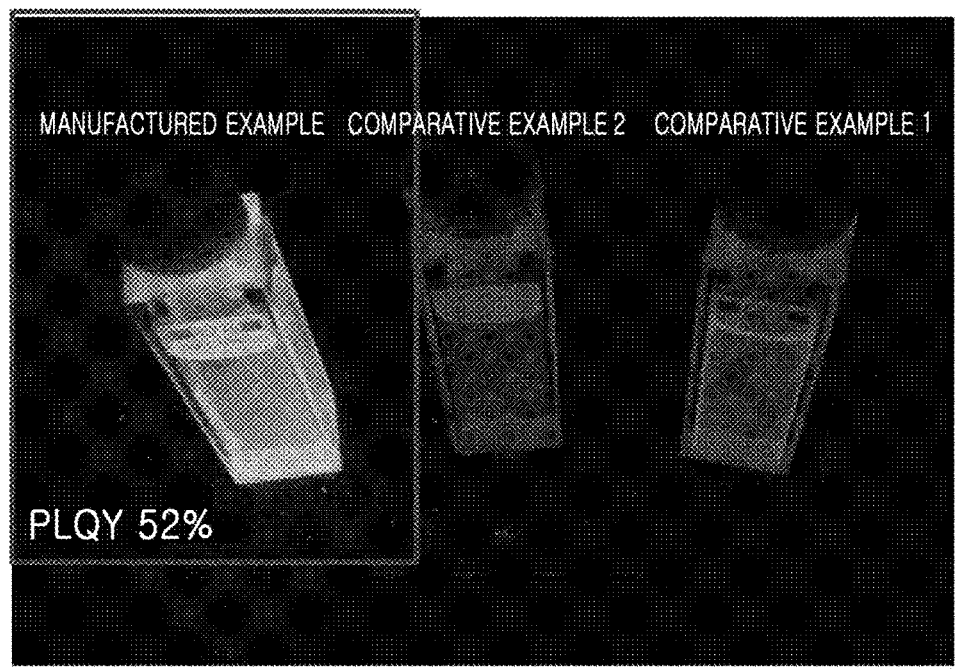
FIG. 7 is a fluorescence image in which light emitted by irradiating light-emitters according to Production Example 1, Comparative Example 1, and Comparative Example 2 with ultraviolet rays is captured.

FIG. 7 is a fluorescence image in which light emitted by irradiating light-emitters according to Production Example 1, Comparative Example 1, and Comparative Example 2 with ultraviolet rays is captured.

Referring to FIG. 7, it can be confirmed that the perovskite solutions, in a bulk form rather than a nanocrystal form, according to Comparative Example 1 and Comparative Example 2 emit dark light, and the light-emitter, in a nanocrystal form, according to Production Example 1 emits very bright green light.

Also, as a result of measuring a photoluminescence quantum yield (PLQY), it was confirmed that the perovskite nanocrystal particle light-emitters according to Production Example 1 had a very high PLQY value of 52%.

On the other hand, in Comparative Example 1 and Comparative Example 2, the perovskites in the form of a thin film which were produced by spin-coating a glass substrate had a low PLQY value of about 1%.

Figure 8:
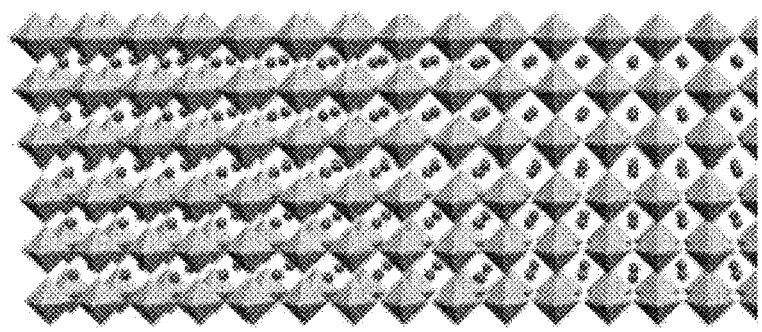
FIGS. 8A and 8B are schematic diagrams of the light-emitters according to Production Example 1 and Comparative Example 1.
Figure 8:
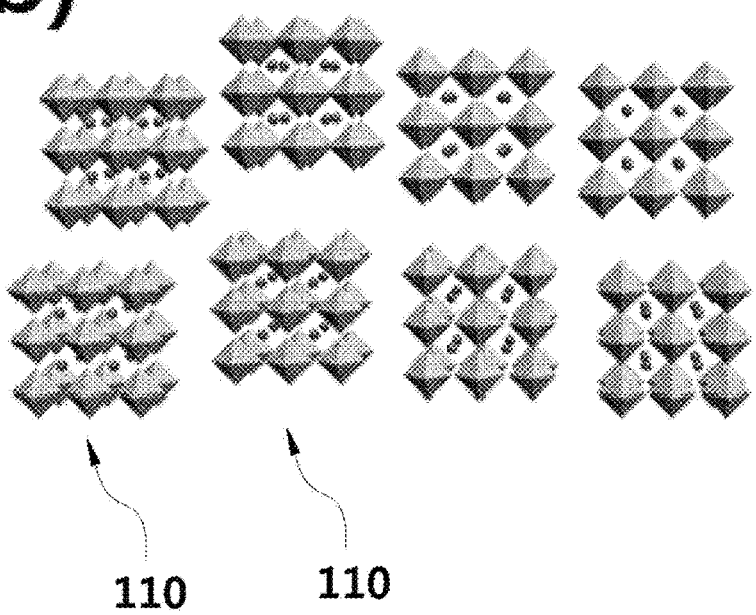

FIGS. 8A and 8B are schematic diagrams of the light-emitters according to Production Example 1 and Comparative Example 1.

FIG. 8A is a schematic diagram of the light-emitter thin film according to Comparative Example 1, and FIG. 8B is a schematic diagram of the light-emitter thin film according to Production Example 1. Referring to FIG. 8A, in Comparative Example 1, a thin film was formed by spin-coating a glass substrate with the first solution. Referring to FIG. 8B, the light-emitter according to Production Example 1 was formed in the form of nanocrystals 110.

FIGS. 9A to 9D are images in which photoluminescence matrices of the light-emitters according to Comparative Example 1 and Production Example 1 were captured at low temperature and room temperature, respectively.

Figure 9:
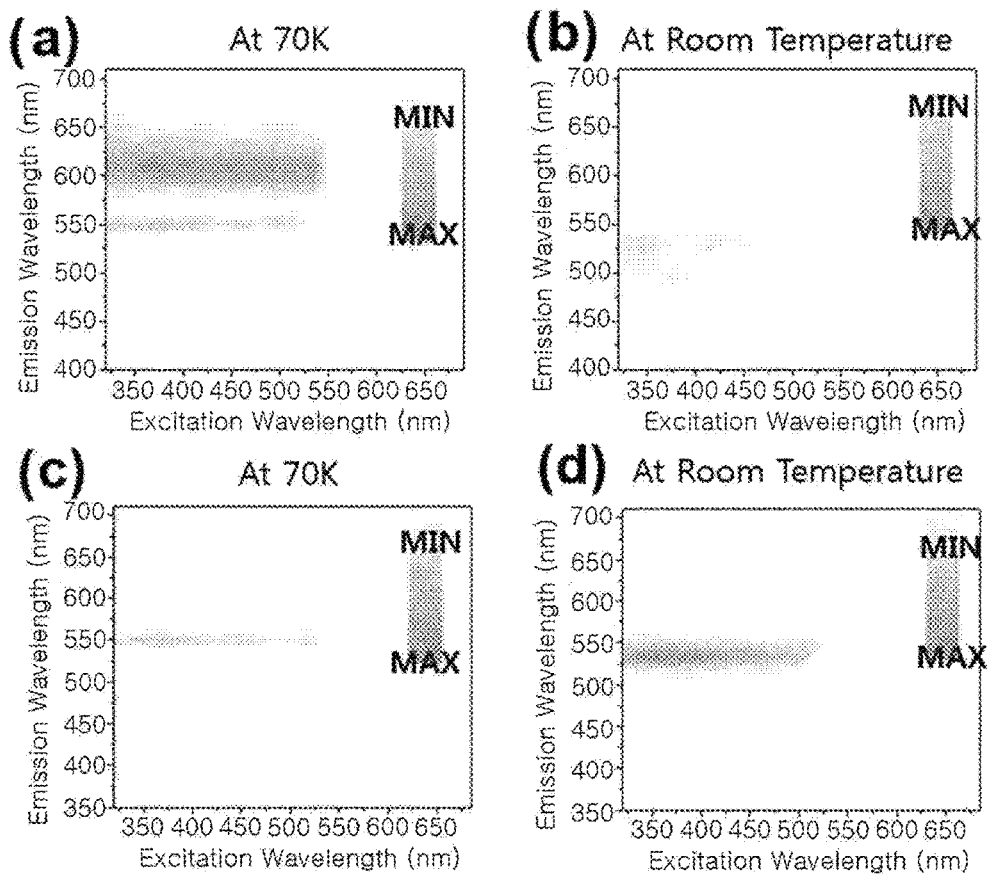
FIGS. 9A to 9D are images in which photoluminescence matrices of the light-emitters according to Comparative Example 1 and Production Example 1 were captured at low temperature and room temperature, respectively.

FIG. 9A is an image in which a photoluminescence matrix of the perovskite in the form of a thin film, according to Comparative Example 1 was captured at low temperature (70 K), and FIG. 9B is an image in which a photoluminescence matrix of the perovskite, in the form of a thin film, according to Comparative Example 1 was captured at room temperature.

FIG. 9C is an image in which a photoluminescence matrix of the perovskite nanocrystal particle thin film according to Production Example 1 was captured at low temperature (70 K), and FIG. 9D is an image in which a photoluminescence matrix of the perovskite nanocrystal particle thin film according to Production Example 1 was captured at room temperature.

Referring to FIGS. 9A to 9D, it can be confirmed that the perovskite nanocrystal particle thin film according to Production Example 1 showed photoluminescence at the same position as the perovskite, in the form of a thin film, according to Comparative Example 1, and showed higher color purity. Also, it can be confirmed that, at room temperature, the perovskite nanocrystal film according to Production Example 1 showed photoluminescence having high color purity at the same position as at low temperature, and luminescence intensity thereof was not decreased. On the other hand, the perovskite, in the form of a thin film, according to Comparative Example 1 had different color purities and light emission positions at room temperature and low temperature. At room temperature, excitons may not lead to light emission due to thermal ionization and delocalization of a charge carrier, were separated into free charges, disappeared, and thus showed low luminescence intensity.

Figure 10:
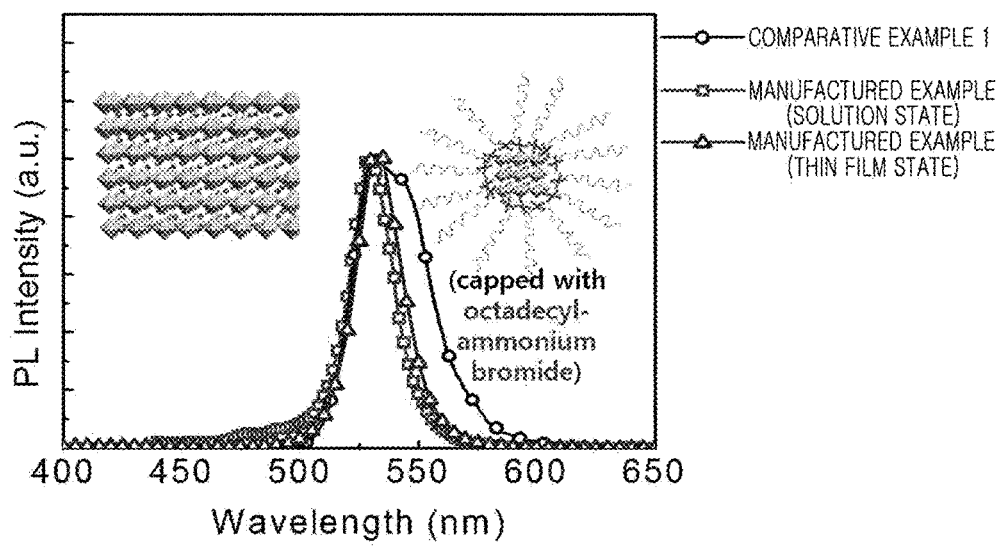
FIG. 10 is a result graph in which photoluminescence of each of the light-emitters according to Production Example 1 and Comparative Example 1 is captured.

FIG. 10 is a result graph in which photoluminescence of each of the light-emitters according to Production Example 1 and Comparative Example 1 is captured.

Referring to FIG. 10, it can be confirmed that both a solution state in which the perovskite nanocrystal particle light-emitter according to Production Example 1 was located in the solution and a thin film state in which a thin film was formed by using the nanocrystal particle light-emitter showed photoluminescence at the same position as that of the perovskite according to Comparative Example 1, and showed higher color purity.

In the nanocrystal particle light-emitter including the perovskite nanocrystal according to the present invention, a perovskite having a crystalline structure in which a FCC structure and a BCC structure are combined may be formed in a nanocrystal particle light-emitter, a lamellar structure in which an organic plane and an inorganic plane are alternately stacked may be formed, and excitons may be confined to the inorganic plane to show high color purity.

Also, an exciton diffusion length may be reduced and an exciton binding energy may be increased in a nanocrystal within a size of 300 nm, and thus exciton destruction due to thermal ionization and delocalization of a charge carrier may be prevented and light luminescence efficiency may be obtained at a high room temperature.

Also, a 2D perovskite is synthesized as a nanocrystal in comparison to a 3D perovskite, and thus an exciton binding energy may be increased not only to further improve the light luminescence efficiency but also to increase durability and stability.

Also, a nanocrystal is made in a gradient-alloy type, and thus a content of the perovskite present in large quantities outside the nanocrystal and a content of the perovskite present in large quantities inside the nanocrystal may be gradually changed. Such a gradual change in the content inside the nanocrystal may be used to uniformly adjust a fraction in the nanocrystal, to reduce surface oxidation, and to improve exciton confinement in the perovskite present in large quantities inside the nanocrystal, and thus light luminescence efficiency may be improved and durability and stability may be increased.

Meanwhile, the embodiments disclosed in this specification and drawings are only examples for the sake of understanding and the invention is not limited thereto. It is clear to those skilled in the art that various modifications based on the technological scope of the invention in addition to the embodiments disclosed herein can be made.

EXPLANATION OF REFERENCE NUMERALS

100: ORGANIC/INORGANIC/HYBRID PEROVSKITE NANOCRYSTAL PARTICLE
100': ORGANIC/INORGANIC/HYBRID PEROVSKITE NANOCRYSTAL PARTICLE HAVING CORE-SHELL STRUCTURE
100": ORGANIC/INORGANIC/HYBRID PEROVSKITE NANOCRYSTAL PARTICLE LIGHT EMITTING BODY HAVING GRADIENT STRUCTURE
110: ORGANIC/INORGANIC/HYBRID PEROVSKITE NANOCRYSTAL CORE
120: ORGANIC/INORGANIC LIGAND 130: SHELL
140: ORGANIC/INORGANIC/HYBRID PEROVSKITE NANOCRYSTAL STRUCTURE HAVING GRADIENT STRUCTURE

The invention claimed is:

1. An organic/inorganic/hybrid perovskite nanocrystal particle light-emitter having a gradient structure, the light-emitter comprising an organic/inorganic/hybrid perovskite nanocrystal structure which is dispersible in an organic solvent or organic material,
wherein the nanocrystal structure has a gradient composition in which a composition is changed from the center thereof to the outside.

2. The light-emitter of claim 1, wherein the organic solvent includes a polar solvent or a a non-polar solvent,
wherein:
the polar solvent includes dimethylformamide, gamma butyrolactone, N-methylpyrrolidone, dimethyl sulfoxide or isopropyl alcohol; and
the non-polar solvent includes dichloroethylene, trichlorethylene, chloroform, chlorobenzene, dichlorobenzene, styrene, xylene, toluene, or cyclohexene.

3. The light-emitter of claim 1, wherein the organic/inorganic/hybrid perovskite nanocrystal particle has a spherical, cylindrical, elliptical pillar, polygonal pillar shape.

4. The light-emitter of claim 1, wherein a size of the nanocrystal particle ranges from 1 nm to 900 nm.

5. The light-emitter of claim 1, wherein a bandgap energy of the organic/inorganic/hybrid perovskite nanocrystal particle is determined by a crystalline structure without depending on the size of the particle.

6. The light-emitter of claim 1, wherein the organic/inorganic/hybrid perovskite has a structure of $ABX_{3-h}X'_h$, $A_2BX_{4-l}X'_l$, or $ABX_{4-k}X'_k$,
wherein:
A is an organic ammonium material, B is a metal material, X is Br, X' is Cl, h is real number of 0 to 3, and l and k are real numbers of 0 to 4; and
values of h, l, and k are increased from a center of the nanocrystal structure to the outside.

7. The light-emitter of claim 6, wherein:
the A is $(CH_3NH_3)_n$, $(C_mH_{2m+1})_xNH_{4-x}$, $((C_mH_{2m+1})_yNH_{3-y})(CH_2)_zNH_3$, $(CF_3NH_3)$, $(C_mF_{2m+1})_xNH_{4-x}$, $((C_mF_{2m+1})_yNH_{3-y})(CH_2)_zNH_3$, $(CH(NH_2)_2)$, $(C_mH_{2m+1})(C(NH_2)_2)$, $(C_mF_{2m+1})(C(NH_2)_2)$, metal, or a combination thereof (where n, m, x, y, and z are integers greater than 1 or equal to 1); and
the B is a bivalent transition metal, a molecule, a rare-earth metal, an alkaline-earth metal, Pb, Sn, Ge, Ga, In, Al, Sb, Bi, Po, or a combination thereof.

8. The light-emitter of claim 6, wherein the values of h, l, and k are gradually increased from the center of the nanocrystal structure to the outside.

9. The light-emitter of claim 6, wherein the values of h, l, and k are increased stepwise from the center of the nanocrystal structure to the outside.

10. The light-emitter of claim 1, further comprising a plurality of organic ligands configured to surround the perovskite nanocrystal structure.

11. The light-emitter of claim 10, wherein the organic ligands include an alkyl halide.

12. The light-emitter of claim 11, wherein an alkyl structure of the alkyl halide includes an acyclic alkyl having a structure of $C_nH_{2n+1}$, a primary alcohol, a secondary alcohol, a tertiary alcohol, an alkylamine, p-substituted aniline, phenyl ammonium, or fluorine ammonium.

13. A light emitting element comprising:
a first electrode;
a second electrode; and
a light emitting layer, which is located between the first electrode and the second electrode and includes the organic/inorganic/hybrid perovskite nanocrystal particle light-emitter having a gradient structure according to claim 1.

14. A method of producing an organic/inorganic/hybrid perovskite nanocrystal particle light-emitter having a gradient structure, the method comprising:
preparing an organic/inorganic/hybrid perovskite nanocrystal particle having a core-shell structure in which a composition of a core is different from a composition of a shell; and
forming the organic/inorganic/hybrid perovskite nanocrystal particle having a core-shell structure so as to have a gradient composition through interdiffusion by performing heat treatment thereon.

15. The method of claim 14, wherein the preparing of the organic/inorganic/hybrid perovskite nanocrystal particle having a core-shell structure includes:
preparing a first solution in which a first organic/inorganic/hybrid perovskite is dissolved in a polar solvent and a second solution in which an alkyl halide surfactant is dissolved in an non-polar solvent;
forming a core including a first organic/inorganic/hybrid perovskite nanocrystal by mixing the first solution with the second solution; and
forming a shell, which includes a second organic/inorganic/hybrid perovskite nanocrystal and surrounds the core, by adding a third solution, in which a second organic/inorganic/hybrid perovskite having a larger bandgap than that of the first organic/inorganic/hybrid perovskite is dissolved, to the second solution.

16. The method of claim 15, wherein:
the first organic/inorganic/hybrid perovskite has a structure of $ABX_3$, $A_2BX_4$ or $ABX_4$; and
the second organic/inorganic/hybrid perovskite has a structure of $ABX'_3$, $A_2BX'_4$ or $ABX'_4$,
wherein A is an organic ammonium material, B is a metal material, X is Br, and X' is Cl.

17. The method of claim 14, wherein the preparing of the organic/inorganic/hybrid perovskite nanocrystal particle having a core-shell structure includes:
preparing a first solution in which a first organic/inorganic/hybrid perovskite is dissolved in a polar solvent and a second solution in which an alkyl halide surfactant is dissolved in an non-polar solvent;
forming a core including a first organic/inorganic/hybrid perovskite nanocrystal by mixing the first solution with the second solution; and
forming a shell, which has a larger bandgap than that of the core and surrounds the core, by adding an organic ammonium halide solution to the second solution and then stirring.

18. The method of claim 14, wherein the preparing of the organic/inorganic/hybrid perovskite nanocrystal particle having a core-shell structure includes:
preparing a first solution in which a first organic/inorganic/hybrid perovskite is dissolved in a polar solvent and a second solution in which an alkyl halide surfactant is dissolved in an non-polar solvent;
forming a core including a first organic/inorganic/hybrid perovskite nanocrystal by mixing the first solution with the second solution;
thermally decomposing a surface of the core by performing heat treatment on the second solution; and
forming a shell, which has a larger bandgap than that of the core and surrounds the core, by adding an organic ammonium halide solution to the heat-treated second solution.

19. A method of producing an organic/inorganic/hybrid perovskite nanocrystal particle light-emitter having a gradient structure, the method comprising:
preparing a first solution in which a first organic/inorganic/hybrid perovskite is dissolved in a polar solvent and a second solution in which an alkyl halide surfactant is dissolved in an non-polar solvent;
forming a core including a first organic/inorganic/hybrid perovskite nanocrystal by mixing the first solution with the second solution; and
forming a shell, which has a larger bandgap than that of the core and surrounds the core, by adding a third solution, in which a second organic/inorganic/hybrid perovskite is dissolved, to the second solution while changing a composition of the second organic/inorganic/hybrid perovskite.

20. The method of claim 19, wherein the second organic/inorganic/hybrid perovskite has a structure of $ABX_{3-h}X'_h$, $A_2BX_{4-l}X'_l$, or $ABX_{4-k}X'_k$,
wherein:
A is an organic ammonium material or metal, B is a metal or ammonium material, X is Br, and X' is Cl, h is real number of 0 to 3, and l and k are real numbers of 0 to 4; and the third solution, in which the second organic/inorganic/hybrid perovskite is dissolved, is added to the second solution while increasing a value of h, l, or k.

21. An inorganic metal halide perovskite nanocrystal particle light-emitter having a gradient structure, the light-emitter comprising an inorganic metal halide perovskite nanocrystal structure which is dispersible in an organic solvent,
wherein the nanocrystal structure has a gradient composition in which a composition is changed from the center thereof to the outside.

22. The light-emitter of claim 21, wherein the inorganic metal halide perovskite has a structure of $ABX_{3-m}X'_m$, $A_2BX_{4-l}X'_l$, or $ABX_{4-k}X'_k$,
wherein:
A is an alkali metal, B is a metal material, X is Br, X' is Cl, h is real number of 0 to 3, and l and k are real numbers of 0 to 4; and
values of m, l, and k are increased from a center of the nanocrystal structure to the outside.

23. The light-emitter of claim 22, wherein:
the A is Na, K, Rb, Cs, or Fr; and
the B is a bivalent transition metal, a rare-earth metal, an alkaline-earth metal, Pb, Sn, Ge, Ga, In, Al, Sb, Bi, Po, or a combination thereof.

24. The light-emitter of claim 22, wherein values of m, l, and k are gradually increased from the center of the nanocrystal structure to the outside.

25. The light-emitter of claim 22, wherein values of m, l, and k are increased stepwise from the center of the nanocrystal structure to the outside.

26. The light-emitter of claim 21, further comprising a plurality of organic or inorganic ligands configured to surround the perovskite nanocrystal structure.

27. A solar cell comprising:
a first electrode;
a second electrode; and
a photoactive layer, which is located between the first electrode and the second electrode and includes the organic/inorganic/hybrid perovskite nanocrystal particle light-emitter having a gradient structure according to claim 1 or the inorganic metal halide perovskite nanocrystal particle light-emitter having a gradient structure according to claim 21.

* * * * *